(12) United States Patent  
Marinov et al.

(10) Patent No.: US 11,933,639 B2
(45) Date of Patent: Mar. 19, 2024

(54) SENSING SYSTEM COMPRISING A CHAIN OF SENSORS

(71) Applicant: Melexis Bulgaria EOOD, Sofia (BG)

(72) Inventors: Tsvetan Marinov, Sofia (BG); Rumen Peev, Sofia (BG)

(73) Assignee: MELEXIS BULGARIA EOOD, Sofia (BG)

(*) Notice: Subject to any disclaimer, the term of this patent is extended or adjusted under 35 U.S.C. 154(b) by 0 days.

(21) Appl. No.: 17/946,802

(22) Filed: Sep. 16, 2022

(65) Prior Publication Data

US 2023/0089705 A1    Mar. 23, 2023

(30) Foreign Application Priority Data

Sep. 17, 2021 (EP) .................................... 21472007

(51) Int. Cl.
G01D 5/14 (2006.01)
G01R 19/165 (2006.01)

(52) U.S. Cl.
CPC .......... *G01D 5/14* (2013.01); *G01R 19/16576* (2013.01)

(58) Field of Classification Search
CPC ............................. G01D 5/14; G01R 19/16576
See application file for complete search history.

(56) References Cited

U.S. PATENT DOCUMENTS

| | | |
|---|---|---|
| 11,206,018 B2 | 12/2021 | Peev et al. |
| 2010/0061723 A1 | 3/2010 | Heimlicher et al. |
| 2011/0180709 A1* | 7/2011 | Craddock ............... G01J 9/00 |
| | | 250/214.1 |
| 2021/0328586 A1 | 10/2021 | Peev et al. |
| 2022/0307830 A1* | 9/2022 | Drewett ................ G01C 9/06 |

FOREIGN PATENT DOCUMENTS

| | | |
|---|---|---|
| DE | 102019134734 A1 | 6/2021 |
| EP | 3531083 A1 | 8/2019 |

OTHER PUBLICATIONS

European Search Report from corresponding European Patent Application No. EP 21 47 2007.0, dated Feb. 22, 2022.

* cited by examiner

*Primary Examiner* — Walter L Lindsay, Jr.
*Assistant Examiner* — Milton Gonzalez
(74) *Attorney, Agent, or Firm* — Workman Nydegger (57) ABSTRACT

A sensor and a sensing system includes a chain of sensors, wherein each sensor comprises an input control port, an output control port, a power interface and an output interface, and is configured such that, when the sensor is powered over the power interface, an enable signal at the input control port triggers the sensor for executing a sequence which comprises measuring a physical property, and subsequently transmitting an enable signal over the output control port. The output control port of an earlier sensor is connected with the input control port of a next sensor. A first sensor is configured for repeating the sequence with a predefined period.

15 Claims, 6 Drawing Sheets

SENSING SYSTEM COMPRISING A CHAIN OF SENSORS

FIELD OF THE INVENTION

The invention relates to the field of sensors and sensing systems. More specifically it relates to sensing systems comprising a chain of sensors, and sensors therefore.

BACKGROUND OF THE INVENTION

Sensing systems which comprise a plurality of sensors operating in sleep/awake manner which are organized in a chain may be subject to power supply issues. For example, in case of printed circuit board (PCB) strip applications the resistance of the PCB traces used to supply the sensors (e.g., integrated circuits (ICs)) is usually in the vicinity of 1-2Ω per meter. A sensor pitch of 5 mm leads to 200 ICs per meter, each consuming approximately 2 mA. Therefore, the total peak system supply current is approximately 400 mA per meter.

Therefore, power supplies should be provided which can generate such a total current and the supply voltage should be high enough to compensate the voltage drop over the PCB traces so that the furthest IC still has sufficient supply voltage (the voltage drop can be more than 1V for modules a few meters long). Such peak currents, moreover, result in high electromagnetic compatibility (EMC) emissions due to switching relatively high current on and off in a large module (acting as efficient antenna).

In prior art devices these problems are typically solved by providing sufficiently large filter capacitors distributed alongside the PCB strip, by oversizing the power supply, by increasing the supply voltage, and by shielding the sensing system, thus resulting in an increased cost of the total device. Implementations may also be limited to short PCB strips (for example less than 1 m).

There is therefore a need for alternative sensing systems comprising a chain of sensors and for sensors for such sensing systems.

SUMMARY OF THE INVENTION

It is an object of embodiments of the present invention to provide a good sensor and sensing system, comprising a chain of sensors, for measuring a physical property.

The above objective is accomplished by a device and system according to the present invention.

In a first aspect embodiments of the present invention relate to a sensor for a sensing system comprising a chain of these sensors. The sensor comprising an input control port, an output control port, a power interface and an output interface. The sensor is configured such that, when the sensor is powered over the power interface, an enable signal at the input control port triggers the sensor for executing a sequence which comprises measuring a physical property, and subsequently transmitting an enable signal over the output control port, wherein the sensor is configured for outputting a result of the measurement over the output interface.

It is an advantage of embodiments of the present invention that a plurality of such sensors can be chained together. The peak supply current of such a chain is reduced compared to a sensing system in which all sensors are continuously active.

In embodiments of the present invention the sensor is configured for repeating the sequence with a predefined period if the enable signal at its input port lasts longer than the predefined period.

It is an advantage of embodiments of the present invention that the sensor is arranged for repeating the sequence with a predefined period. When putting such a sensor as first sensor in a daisy chain, it will start the measurement repeatedly without the need for closing the loop of sensors or without the need for providing an additional trigger connection or microcontroller for triggering the start of a new sequence.

In embodiments of the present invention the sensor is a magnetic field sensor, or a capacitive sensor, or an optical sensor.

In embodiments of the present invention the sensor comprises a comparator, for comparing the measured physical property with a threshold value, and an output switch and the output interface comprises a first output node connected to the output switch, and the sensor is configured for switching the output switch when the threshold value is crossed.

In embodiments of the present invention the sensor comprises a comparator, for comparing the measured physical property with a threshold value, and an output switch and the output interface comprises a first and a second output node and the output switch is connected between the first and the second output node, wherein the sensor is configured for switching the output switch when the threshold value is crossed.

In such embodiments the result of measurement of a sensor is an opened or closed switched.

In a second aspect embodiments of the present invention relate to a sensing system for measuring a physical property. The sensing system comprises a plurality of sensors in accordance with embodiments of the present invention. In such a sensor system the output control port of an earlier sensor is connected with the input control port of a next sensor thus forming a chain of sensors. A first sensor in the chain of sensors is configured for repeating the sequence with a predefined period. In embodiments of the present invention the predefined period may be longer than or equal to a duration required for the plurality of sensors to execute the sequence consecutively. In alternative embodiments of the present invention the predefined period may be shorter than this duration.

It is an advantage of embodiments of the present invention that the peak supply current of the sensing system is reduced compared to a sensing system in which all sensors are in awake state at the same time.

In embodiments of the present invention a single master (the first sensor) and a plurality of slaves are connected to each other in a daisy chain using two dedicated ports (the input control port and the output control port).

In embodiments of the present invention all sensors of the system may be configured for repeating the sequence with the predefined period.

In embodiments of the present invention the sensing system may comprise a printed circuit board, wherein the sensors are provided on the printed circuit board and wherein connections with the power interfaces, between the input control ports and the output control ports, and with the output interfaces are achieved through printed circuit board traces.

In embodiments of the present invention the sensing system comprising one or more AD converters connected with the output interfaces. In embodiments of the present invention a processing unit may be connected with the one or more AD converters.

The AD converters may be shared between the different interfaces or there may be a separate AD converter per interface.

In embodiments of the present invention the sensing system comprises a display device directly connected with the output interface and configured for displaying the measured physical property.

In embodiments of the present invention the input control port of the first sensor is connected to a fixed potential or is left floating.

In embodiments of the present invention each output control port of one sensor, which is connected with an input control port of another sensor, is only connected with one input control port. In embodiments of the present invention each input control port is connected with maximum one output control port.

In embodiments of the present invention at least one of the output control ports is connected with more than one input control port. It is an advantage of embodiments of the present invention that multiple sensors can be enabled at the same time. This allows to reduce the processing time of the complete array of sensors, versus an increased power consumption.

In embodiments of the present invention the number of sensors is at least 10, it may for example be at least 100 or even at least 1000.

In embodiments of the present invention a pitch of one sensor is 5 mm. In a line configuration of sensors with a 5 mm pitch, a sensing range of 5 m can be obtained with 1000 sensors.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Figure 1:
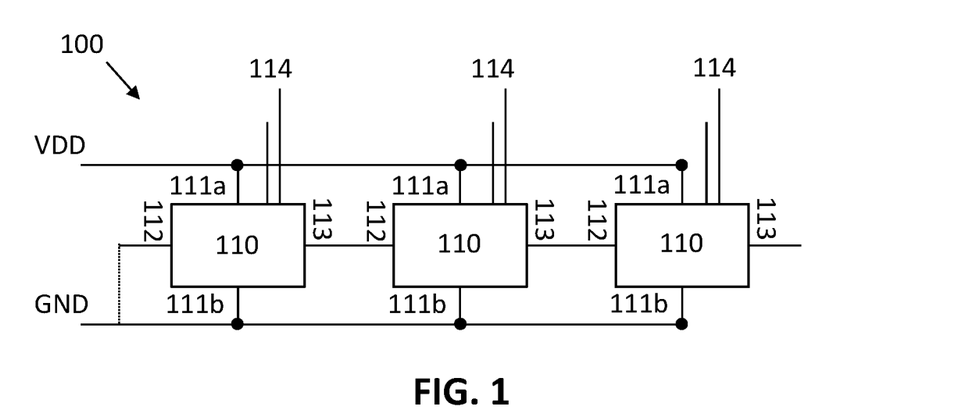
FIG. 1 shows a schematic block diagram of an exemplary sensor and exemplary sensing system according to an exemplary embodiment of the present invention.

In a first aspect embodiments of the present invention relate to a sensor 110 for a sensing system 100 comprising a chain of such sensors in accordance with embodiments of the present invention and in a second aspect embodiments of the present invention relate to a sensing system 100 for measuring the physical property. A schematic block diagram of an exemplary sensor and exemplary sensing system according to an exemplary embodiment of the present invention is shown in FIG. 1.

A sensing system 100 according to embodiments of the present invention comprises a plurality of sensors 110 configured for measuring the physical property.

Each sensor comprises an input control port 112, an output control port 113, a power interface 111 and an output interface 114. Each sensor 110 is configured such that, when the sensor 110 is powered over the power interface 111, an enable signal at the input control port 112 triggers the sensor 110 for executing a sequence which comprises measuring the physical property, and subsequently transmitting an enable signal over the output control port 113. Each sensor is configured for outputting a result of the measurement over the output interface 114.

In embodiments of the present invention the output control port 113 of an earlier sensor 110 is connected with the input control port 112 of a next sensor 110 thus forming a chain of sensors. In this chain of sensors, a first sensor in the chain is configured for repeating the sequence with a predefined period.

In embodiments of the present invention the predefined period may be shorter than a duration required for the plurality of sensors to execute the sequence consecutively, but large enough such that not all sensors are active at the same time. In that case multiple, but not all sensors are active at the same time. In this case two or more "waves" of active sensors will exist in the chain. In this case, multiple 'sub-chains' of operating sensors are formed within the full chain. In other words, in this case multiple sensors operate at the same time. In such a case there is a peak power reduction with relation to a system where all the sensors operate at the same time. For example, if the period is substantially equal to a duration required for 10 sensors to execute the sequence consecutively, then it means that 10% of the sensors within the chain would operate simultaneously. That is already a 90% peak power reduction. To push the reason to an extreme end: if the period is equal to a duration required for 2 sensors to execute the sequence consecutively, then 50% of the sensors are operating at the same time.

In embodiments of the present invention the predefined sequence may be longer than or equal to a duration required for the plurality of sensors to execute the sequence. In that case one single sensor is operating at a single moment in time.

The predefined period may for example be equal to or bigger than the duration of one sequence times the number of sensors in a chain. The duration of one sequence of a sensor is also referred to as an operating period of the sensor.

In embodiments of the present invention the sensor is configured such that after measuring the physical property, the sensor stops measuring until a new enable signal is received. The power consumption is thereby reduced when not measuring.

Figure 7:
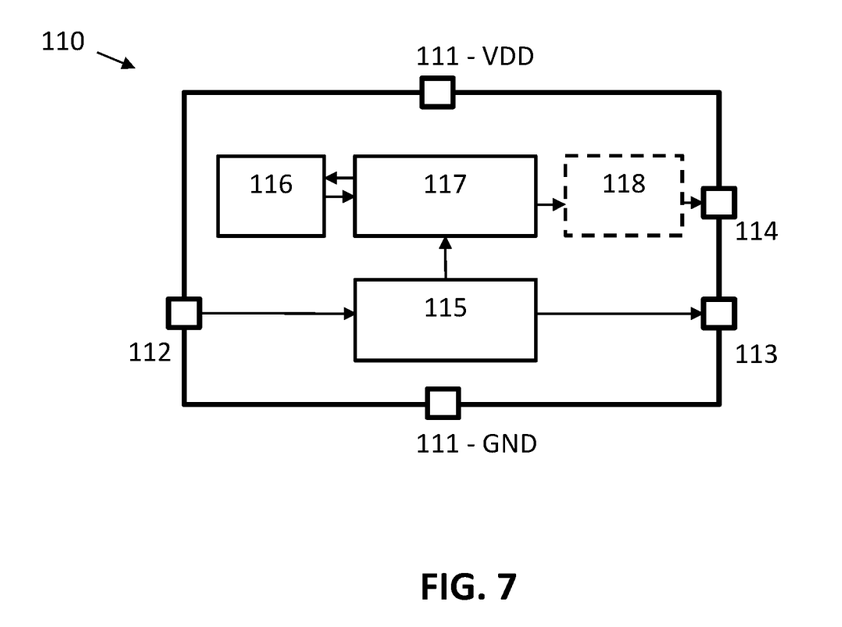
FIG. 7 shows a schematic diagram of a sensor in accordance with embodiments of the present invention.

FIG. 7 shows a schematic drawing of a sensor 110 in accordance with embodiments of the present invention. The sensor comprises a power interface 111 for powering the sensor. In this example the power interface comprises a first terminal for applying the supply voltage VDD and a second terminal for connecting with ground GND. The sensor 110 further comprises a control circuit 115 connected with the input control port 112 and the output control port 113. The control circuit 115 is configured for triggering a measurement circuit 117 to start measuring a physical property. The control circuit is, furthermore, configured subsequently transmitting an enable signal over the output control port 113. In this example the sensor comprises the measurement circuit 117 which start measuring the physical property using the sensing element 116. The sensing element 116 may for example be a magnetic sensor, a capacitive sensor, a resistive sensor, or an optical sensor. The measurement circuit 117 may for example comprise driving circuitry for applying a current through the sensing element 116 and receiving circuitry for filtering and/or amplifying an output signal from the sensing element 116. The sensing element may be a Hall plate, or a Wheatstone bridge having four or more terminals (e.g., two biasing terminals and two sensing terminals). In this example the sensor 110, furthermore, comprises a comparator 118 for comparing the measured physical property with a threshold value and outputting the comparison result over the output interface 114. In alternative embodiments of the present invention the direct measurement result of the physical property may be outputted over the output interface.

Figure 8:
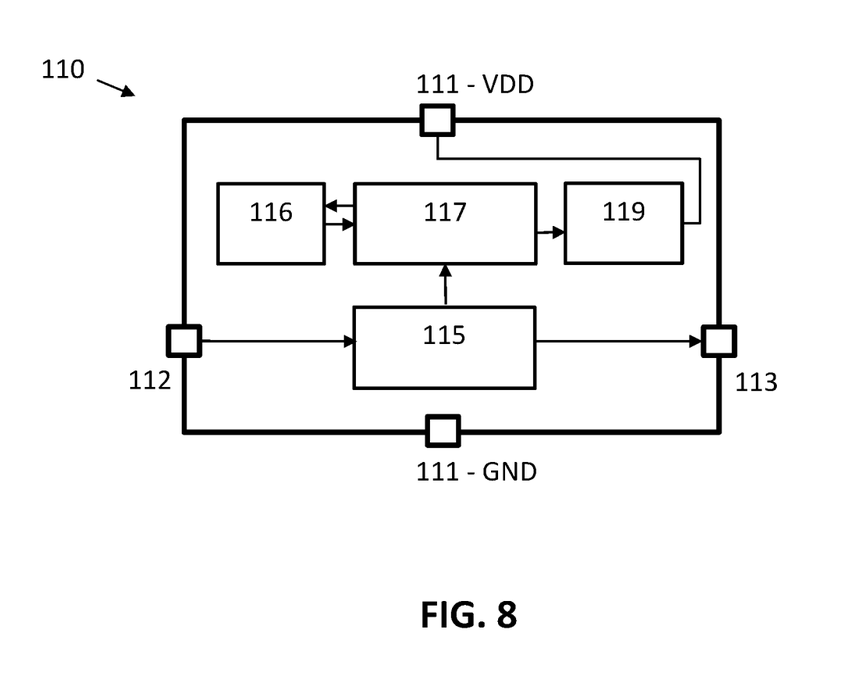
FIG. 8 shows a schematic diagram of a sensor in accordance with embodiments of the present invention, wherein the power interface and the output interface share a terminal.

In embodiments of the present invention the output interface and the power interface may share a terminal. An example thereof is illustrated in the schematic drawing in FIG. 8. This schematic drawing is similar is the one in FIG. 7, except for the output block 119. Whereas in FIG. 7 the output result is transferred to output interface 114 which has a different terminal than power interface 111, in FIG. 8 the power interface and the output interface share a same terminal. The sensor can communicate a result of the measurement (e.g., a value or a data frame, or a comparison result) by modulating its supply current. Typically, an additional current is artificially added to the supply current by block 119. A current source may be used. Block 119 may be a voltage-controlled current source, or a digitally controlled current source. Block 119 may be controlled by the measurement circuit 117. The change in supply current can then be detected and decoded downstream of the power supply, or by the power supply itself (e.g., a microcontroller).

In embodiments of the present invention the sensors may be implemented as an integrated circuit.

In embodiments of the present invention the sensing system may comprise an elongated strip module (which may be realized as a printed circuit board) with traces for connecting the input control ports, the output control ports, and the power interfaces of the plurality of device sensors. In embodiments of the present invention the sensing system 100 may comprise a printed circuit board. In such a device the sensors may be provided on the printed circuit board and connections with the power interfaces 111, between the input control ports 113 and the output control ports 114, and with the output interfaces 114 are achieved through printed circuit board traces.

The sensors may be operating in a sleep mode (i.e., reduced power mode when not measuring) and in an awake mode. The awake mode may last a fixed duration. The sum of the sleep duration and the awake duration is also referred to as the operating period. This operating period may be the same for the plurality of sensors. As will be discussed later, different kind of sensors may be used. The sensors may for example be used to detect the presence of a magnet that is moving alongside the strip.

In a prior art system, all sensors may operate at equal periods, and they are typically synchronized in the application by the supply voltage which powers up all sensors at the same time, which will, therefore, all start measuring at the same time. Therefore, in such a prior art system, the peak supply current will be equal to the awake current of each sensor multiplied by the number of sensors in the strip.

It is an advantage of embodiments of the present invention that the peak device supply current is reduced to the sum of the awake current (i.e., when measuring) of a single sensor and the sleep currents (i.e., when not measuring) of the rest of the sensors.

In embodiments of the present invention, during operation, an enable signal is provided on the input control port of the first sensor, which lasts longer than the predefined period. This may for example be obtained by connecting the input control port to ground, or by leaving the input control port floating. The invention is, however, not limited. As will be understood by the skilled person, the enable signal may also be defined differently. It may for example be a fixed potential (e.g., VDD/2).

It is an advantage of embodiments of the present invention that longer senor modules, with reduced requirements for filtering, power supply and design can be produced.

In embodiments of the present invention the sensors are arranged along a dimension and the physical property is measured along the dimension.

It is an advantage of a sensing system in accordance with embodiments of the present invention that the first sensor is arranged for repeating the sequence with the predefined period. The effect thereof is that the last sensor does not need to be connected to the first sensor (loop not closed), and that no trigger connection or addressing is needed from a microcontroller. As the first sensor in the chain is configured for repeating the sequence with the predefined period, each new measurement of the first sensor will trigger a chain of measurements of the subsequent sensors. In that sense this first sensor is also referred to as the master. It is, however, not a master as in conventional communication systems in the meaning that it addresses each of the individual sensors or reads data from each of the individual sensors.

In embodiments of the present invention the sensing system may comprise a plurality of integrated circuits.

In embodiments of the present invention each sensor is configured for repeating the sequence with the predefined period if the enable signal of the sensor lasts longer than the predefined period.

It is thereby an advantage of embodiments of the present invention that the sensing system is fault tolerant in case of breaking of the chain into sub-chains. If the enable signal for the sensor is a floating input control port, braking of the chain will result in a master per sub-chain. This is particularly advantageous because it implies that the sensing system can be manufactured in a long strip and cut to a random length during production without the need to assign the master role manually.

In embodiments of the present invention the input control port 112 of the first sensor is connected to a fixed potential or is left floating. In case of a fixed potential the input control port of the first sensor may for example be connected to ground GND or the supply voltage VDD. The connected signal to the first connector should correspond with the enable signal. Thus, the master role of the first sensor is automatically assigned to the first chip (e.g., by leaving its input control port floating or connecting it to a fixed potential). The rest of the sensors are slaves since their input control ports are connected with an output control port of an earlier sensor. Thus, an enable signal from an earlier sensor triggers the next sensor for executing the sequence. This enable signal is only of a limited duration. It should be shorter than the predefined period. In some embodiments of the present invention the enable signal may be a falling edge or a rising edge, or both a falling edge and a rising edge, or a pulse, or a plurality of pulses, a floating signal, a fixed potential, or a logic state.

In a configuration where the input control port of the first sensor is connected to a fixed potential or left floating the first sensor will start the read sequence of the chain.

In embodiments of the present invention the output port of the last sensor is not connected.

In embodiments of the present invention the sensors are positioned in a line. The sensors may be positioned in a substantially straight line.

In embodiments of the present invention the sensors are magnetic field sensors, or capacitive sensors, or optical sensors. To a broader extend other sensors may also be used, e.g., temperature sensors, humidity sensors, gas sensors, etc. In the latter case they would rather transmit a digital value, and not compare the value to a threshold and output a binary signal only.

FIG. 1 show a schematic block diagram of a sensing system 100 in accordance with embodiments of the present invention. The sensing system comprises 3 sensors. Only the input control ports 112, the output control ports 113, the power interfaces 111 and the output interfaces are shown. Other sensor pins and external components ore omitted for simplicity. The purpose of this schematic drawing is to show how the input control ports 112 and the output control ports 113 should be connected for daisy chain operating mode. As discussed before, the effect of the daisy chain operating mode is the reduction of the overall peak supply current by ensuring only a single sensor in the chain is in the awake state (i.e., it is measuring).

Figure 2:
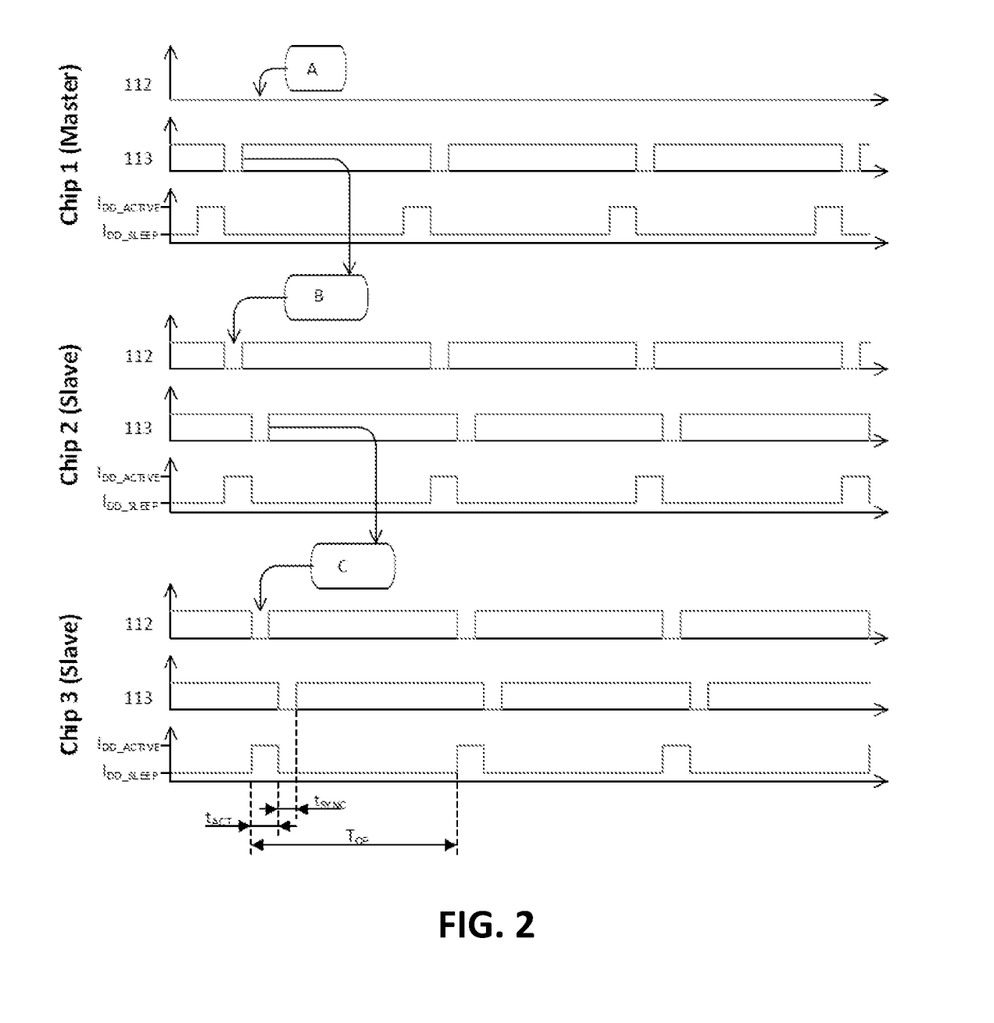
FIG. 2 shows a timing diagram of the signals occurring in the exemplary sensing system schematically illustrated in FIG. 1.

FIG. 2 shows a timing diagram of the signals occurring in the exemplary sensing system 100 schematically illustrated in FIG. 1. Thus, the daisy chain operation mode for three sensors is illustrated. Signals for the first sensor (Chip 1), the second sensor (Chip 2) and the third sensor (Chip 3) are shown. For each sensor the top graph shows the signal at the input control port 112, the middle graph shows the signal at the output control port 113, and the bottom graph shows the sensor status. In this timing diagram the input control pin of the first sensor is floating or connected to GND (the input control pin may for example be connected to a pull-down circuit).

In embodiments of the present invention the sensor 110 comprises a control circuit which is connected with the input control port 112. The control circuit is configured for triggering the sensor for executing the sequence when the enable signal is a floating voltage at the input control port.

In embodiments of the present invention the control circuit is configured for triggering the sensor for executing the sequence when the enable signal is a voltage at the input control port which is above and/or below a predefined threshold or when the enable signal is a falling edge (i.e. transition from a high voltage level to a low voltage level at the input control port) or a rising edge (i.e. transition from a low voltage level to a high voltage level at the input control port). In embodiments of the present invention, the enable signal is a falling edge and a rising edge (or vice versa). In embodiments of the present invention the enable signal is a pulse or a plurality of pulses. The enable signal may be above a first predefined voltage and below a second predefined voltage wherein the first predefined voltage is larger than the second predefined voltage (the latter case corresponds with a window comparator).

The input control pin may be implemented as a digital input pin. Such a pin may be connected to a circuit that generates a logic state (high or low) based on a comparison of the applied voltage being above or below a threshold (or 2 thresholds). For floating state detection, both a pull-up and pull-down may be embedded in the chip, such that when no voltage is applied, the pin will see VDD/2. Alternatively, the first sensor could have its input connected to an external resistive divider such as to detect a fixed potential (e.g., VDD/2) as the enable signal.

As, in this exemplary embodiment of the present invention, the first sensor is always enabled, the first sensor will repeat the sequence with the predefined period T_OP. This period may be programmed or defined in any other suitable way. During this period the first sensor switches between awake and sleep state. The duration of the awake phase is t_ACT. The duration of the awake phase may for example be between 100 μs and 10 ms. At the end of the awake phase, the chip produces a pulse on its output control port with duration of t SYNC. This pulse is used to transition the second sensor from sleep phase to awake phase. The duration of the sync pulse may for example be between 10 μs and 1 ms. Then the second sensor activates third sensor and so on. The duration of t_ACT plus t_SLEEP (not shown) is the duration of one sequence of a sensor and is also referred to as the operating period of the sensor (Top). The sleep duration t_SLEEP may be for example 1 ms to 200 ms.

Figure 3:
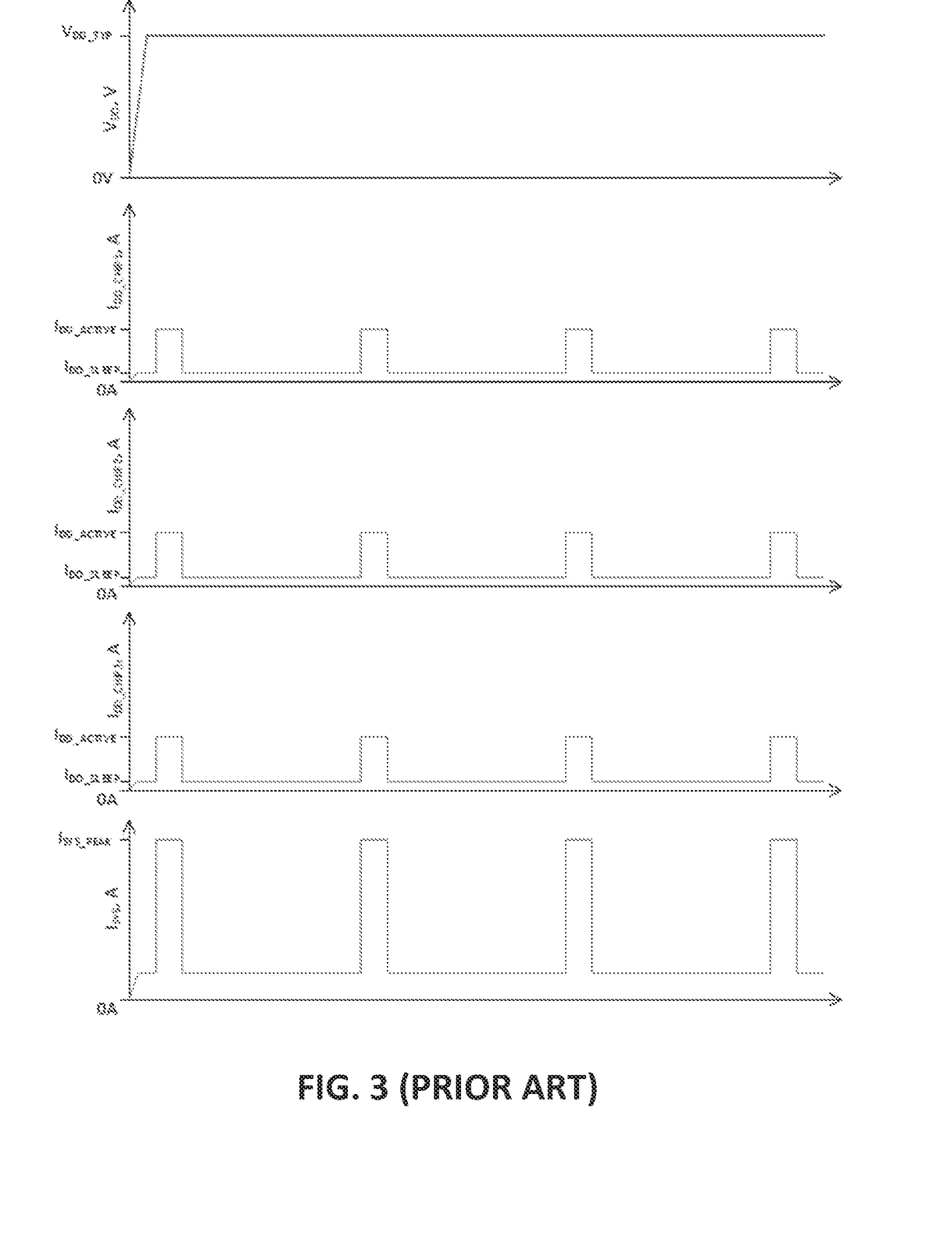
FIG. 3 shows a timing diagram of a prior art sensing system.

The timing diagram illustrated in FIG. 3 is showing how the example system of 3 sensors will behave in the absence of chip-to-chip synchronization (daisy chain). The top graph shows the power supply voltage in function of time. The next three graphs respectively show the sensor current for the first, second, and third sensor, in function of time. The bottom graph shows the total current in function of time. In this case the system peak supply current is:

$$ISYS\_PEAK = N \times IDD\_AWAKE$$

Figure 4:
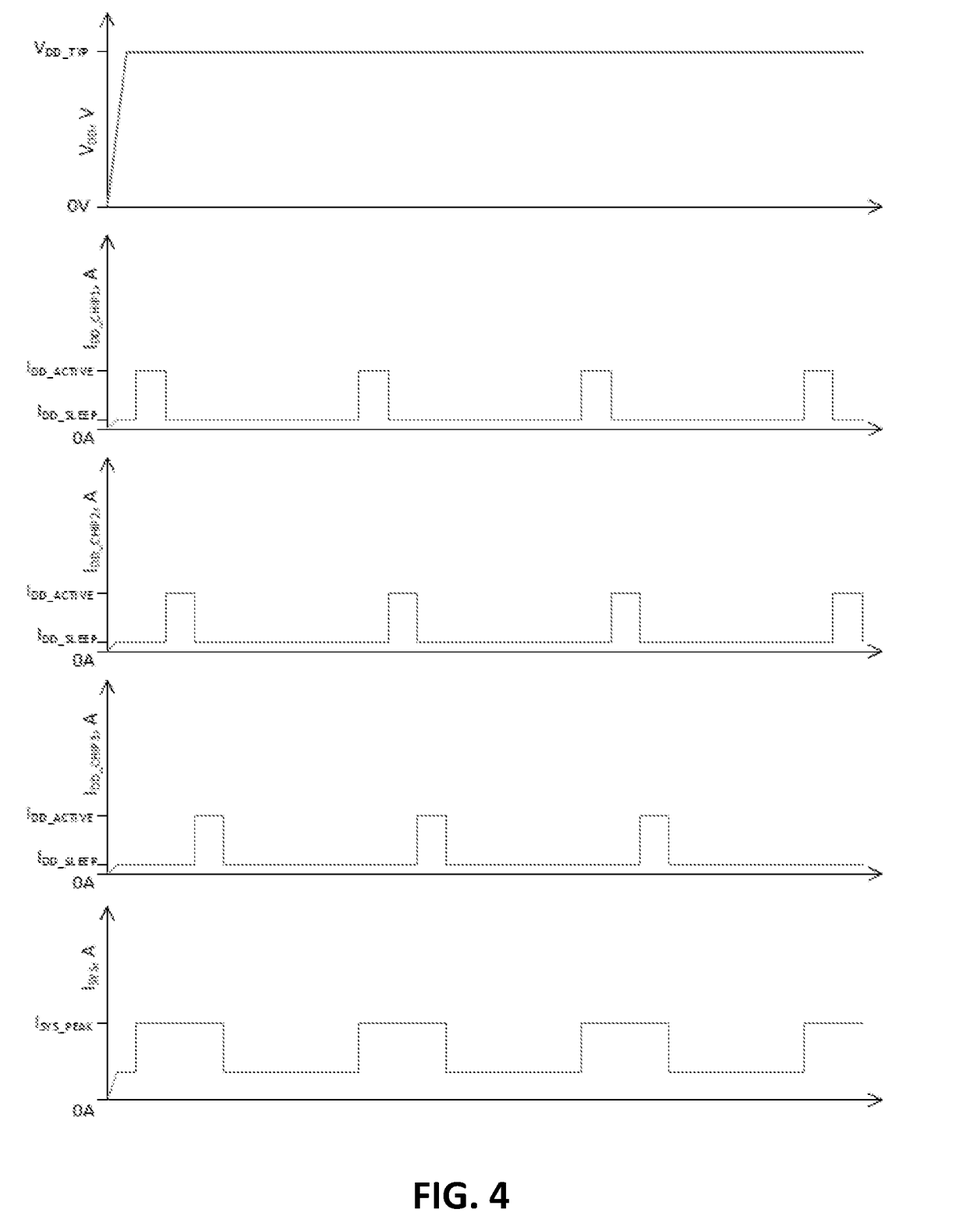
FIG. 4 shows a timing diagram of a sensing system in accordance with embodiments of the present invention.

Where:
ISYS_PEAK is the system peak supply current
N is the number of sensors (e.g., ICs) in the chain
IDD_AWAKE is the current consumption of a single sensor in awake state The timing diagram in FIG. 4 shows currents through the 3 sensors of the exemplary sensing system in accordance with embodiments of the present invention. The top graph shows the power supply voltage in function of time. The next three graphs respectively show the sensor current for the first, second, and third sensor, in function of time. The bottom graph shows the total current in function of time. In this case the peak supply current of the sensing system is:

$$ISYS\_PEAK = (N-1) \times IDD\_SLEEP + IDD\_AWAKE$$

Where:
ISYS_PEAK is the sensing system peak supply current
N is the number of sensors (e.g., ICs) in the chain
IDD_AWAKE is the current consumption of a single sensor in awake state
IDD_SLEEP is the current consumption of a single sensor in sleep state Since IDD_SLEEP is substantially smaller than IDD_AWAKE (for example 20 or 200 times or other), the overall sensing system current consumption is significantly reduced.

In embodiments of the present invention the sensors are comprising a comparator, for comparing the measured physical property with a threshold value, and an output switch. The output interface 114 of a sensor comprises a first and a second output node with the output switch connected between the first and the second output node. Each sensor 110 is configured for switching the output switch when the threshold value is crossed. The sensing system is comprising a resistive divider comprising a plurality of resistors with connecting nodes between the resistors, wherein the first output nodes of the sensors are connected with the respective connecting nodes and wherein the second output nodes are connected together.

In embodiments of the present invention the outer ends of the resistive divider can be connected between a supply voltage and ground. It is an advantage of embodiments of the present invention that the connected second output nodes represent the sensing system output.

An advantage of the voltage divider in conjunction with the in-out enabling mechanism is that the sensor circuits do not require an ID.

Alternatively, the sensors could communicate the measurement output on a digital bus. In that case it would be required to communicate an ID as well, such that a microcontroller can identify which sensor sent the data.

In a third aspect embodiments of the present invention relate to a position sensing device. The position sensing device comprises a sensing system 100 according to embodiments of the present invention. The sensors are configured for measuring a magnetic field. The position sensing device, furthermore, comprises a magnet and a positioning system which is configured for guiding the magnet along the sensors. It is an advantage of embodiments of the present invention that the position of the magnet along the sensing system can be determined from the measurement results of the sensors. Indeed, from the measurement results of the sensors it can be determined which sensor is the closest to the magnet.

Figure 5:
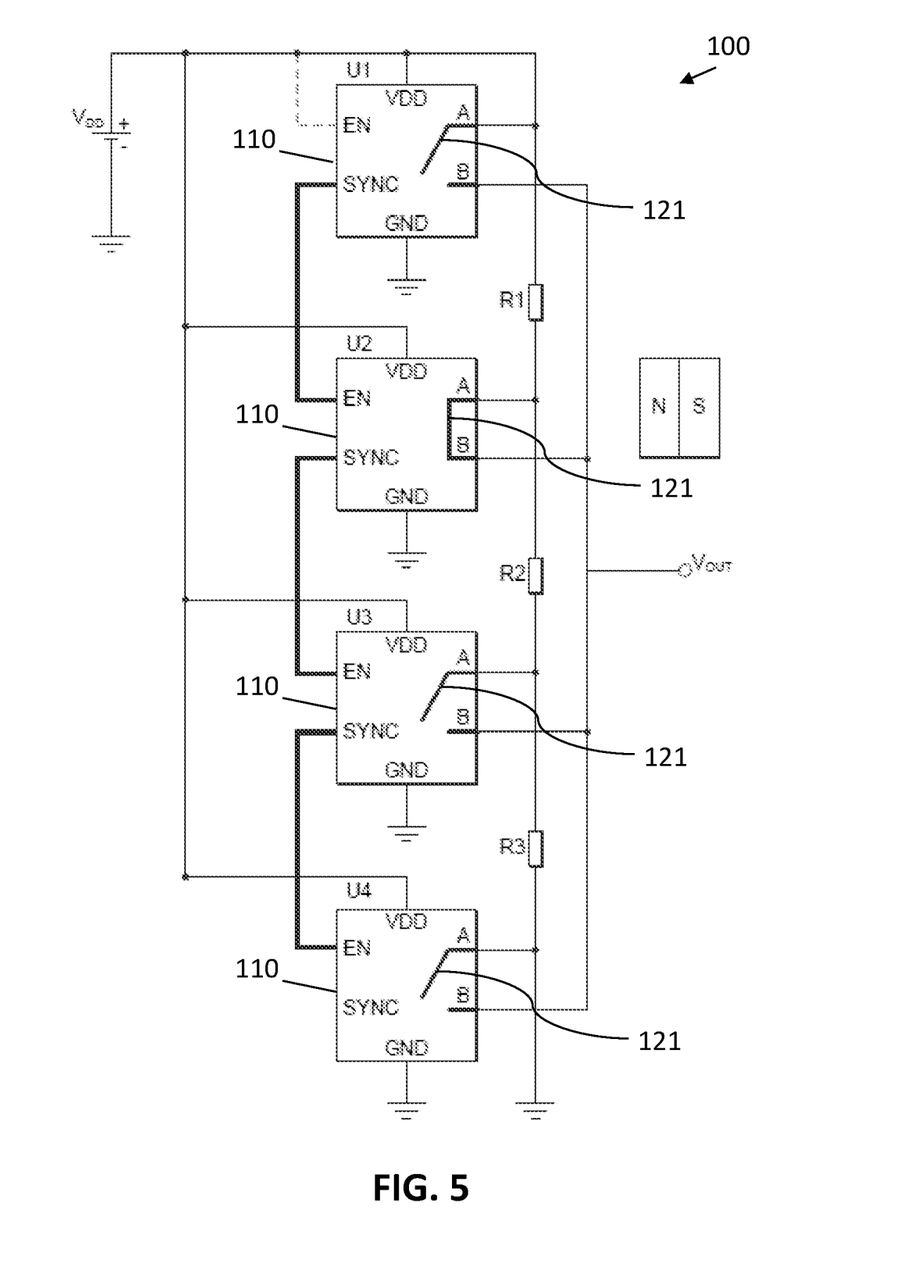
FIG. 5 shows a schematic drawing of a sensing system in accordance with an exemplary embodiment of the present invention wherein a single sensor is enabled at a time.
Figure 6:
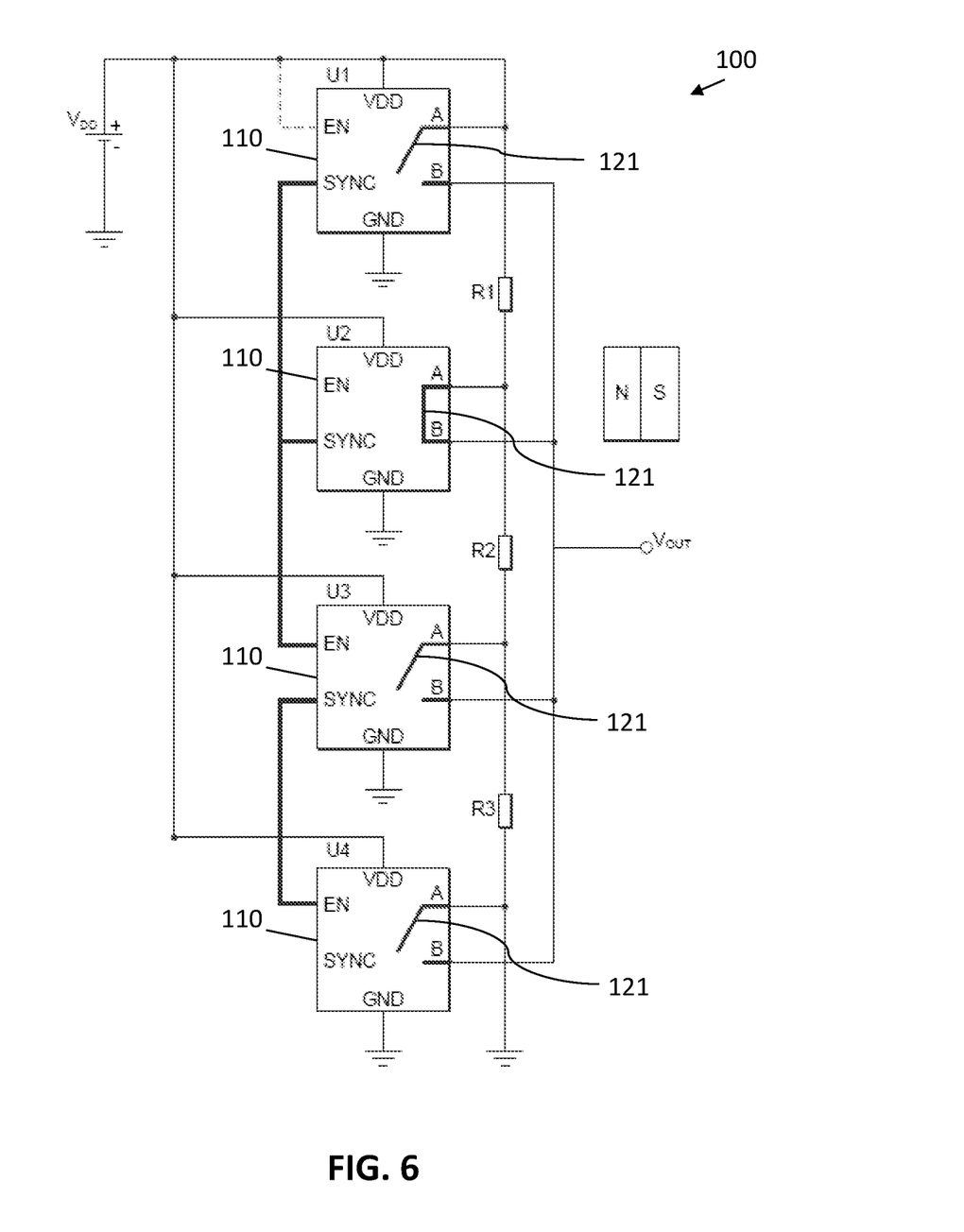
FIG. 6 shows a schematic drawing of a sensing system in accordance with an exemplary embodiment of the present invention wherein multiple sensors are enabled at the same time.

FIG. 5 and FIG. 6 show schematic drawings of a sensing system 100 in in accordance with embodiments of the present invention.

The sensors 110 are arranged for sensing a physical quantity (e.g., a magnetic field). The sensors may include comparison means and an output switch 121 connected to two output nodes. When the physical quantity is above or below a threshold value, the output switch is closed, and the output nodes are electrically connected. Each first sensor output (in this example output A) is connected to a respective node of a resistive divider R1, R2, R3 (the first node may be connected to VDD and the last to GND, but this is not necessary). Each 2nd sensor output (output B) is connected together and represent the sensing system output. It may be connected to an electronic control unit (ECU) and digitized using an analog to digital converter (ADC), or it could be directly connected to a display device, e.g., a gage. In this exemplary embodiment of the present invention the output switch 121 is closed and the output node Vout will be connected to the respective voltage of the voltage divider (in this example, 2 VDD/3), when the physical quantity is detected to be above the threshold. In other embodiments of the present invention there may be only one output node connected to the gate of an external transistor.

The output node Vout may be connected to an additional pull-up or pull-down resistor (not shown), which value is typically higher than the overall resistance of the resistor ladder, such as to set Vout to VDD or GND when no switch is closed. The output node Vout may be connected to a filtering capacitor (not shown) such as to a low-pass filter and keep the output voltage while the chain is being processed. In some embodiments, the chip supply voltage VDD is the same as the resistor ladder (as shown), but it can also be different. In particular, the supply voltage of the resistor ladder may be higher than the chip supply. In the examples illustrated in FIG. 5 and FIG. 6 the sensor chips 110 and the resistor ladder R1, R2, R3 are connected to the same voltage supply VDD and to a common ground.

In this situation, the output switch 121 may be a floating switch. Where in embodiments of the present invention reference is made to a floating switch, reference is made to a switch which is galvanically isolated from the control input (i.e., the input of the switch). Such a floating switch may comprise a floating power supply in the floating domain which is galvanically isolated from the rest of the sensor and a modulator for modulating the input signal of the switch (which, in embodiments of the present invention, is a measure of the physical quantity), thus obtaining a differential signal and a demodulator for demodulating the differential signal in the floating domain wherein the modulator and the demodulator are galvanically isolated. An example of such a floating switch is given in patent application EP20472004, "Floating switch for signal commutation" filed on 15 Apr. 2020 by Melexis, which is included here by reference. When using a floating switch, the sensor chips, and the resistor ladder not necessarily need to be connected to the same voltage supply VDD and to a common ground. The sensors and the resistive ladder may be connected to different voltage domains, for example different VDD and/or different grounds. The power supplies may be floating with respect to each other. For example, the sensors and the resistive ladder may be connected to different grounds and the voltage supply of the resistive divider may be higher than the supply voltage of the sensors (e.g., the voltage supply of the sensor VDD_sensor=1.8V, or 3.3V, or 5V and the voltage supply of the resistive divider VDD_ladder is higher than 5V, or higher than 10V, or higher than 50V).

In an exemplary position sensing device according to embodiments of the present invention the physical quantity may for example be a magnetic field generated by a magnet and may be used for liquid level sensing. The magnet may be coupled to a float arranged to be moving with the top surface of the liquid in a tank. When moving up or down, the magnet changes position in front of the array of magnetic switches (for example illustrated in FIG. 5 or FIG. 6). In such a position sensing device the (analog) output voltage Vout is representative of the level of liquid in the tank.

Such a system can comprise a few magnetic switches, or up to 100, or even more than 1000 sensors (e.g., for 5-meter sensing with a 5 mm pitch, 1000 sensors are required).

Advantages of such a readout in combination with cascaded enable pulses, in accordance with embodiments of the present invention, are:

Only a subset of sensor(s) is enabled at a given time; This reduces the overall power/current consumption and supply voltage drop along the sensor array;

No ID is needed in the sensors (which would be needed in order to address the sensors individually as in state-of-the art digital communication protocols);

No electrical connection/communication interface/control signal is needed from the ECU other than the analog output Voltage; This reduces the wire harness.

In the schematic drawing illustrated in FIG. 6 is illustrated that the invention is not limited to a single enabled sensor at a time. Multiple sensors can be enabled at the same time, as in the example depicted in FIG. 6 (the two central sensors are enabled at the same time). In this example at least one of the output control ports is connected with more than one input control port. This allows to reduce the processing time of the complete array of sensors, versus an increased power consumption. When a high number of sensors are used, a trade-off between processing time and current consumption can be found.

In a fourth aspect embodiments of the present invention relate to a kit of parts. The kit of parts comprising a plurality of sensors in accordance with embodiments of the present invention for building a sensor system in accordance with embodiments of the present invention.

The invention claimed is:

1. A sensor for a sensing system comprising a chain of these sensors, the sensor comprising an input control port, an output control port, a power interface and an output interface, wherein the sensor is configured such that, when the sensor is powered over the power interface, an enable signal at the input control port triggers the sensor for executing a sequence which comprises measuring a physical property, and subsequently transmitting an enable signal over the output control port, wherein the sensor is configured for outputting a result of the measurement over the output interface.

2. The sensor according to claim 1, wherein the sensor comprises a control circuit, connected with the input control port, configured for triggering the sensor for executing the sequence when the enable signal at the input control port is a fixed potential or a floating voltage.

3. The sensor according to claim 1, wherein the sensor comprises a control circuit, which is connected with the input control port, configured for triggering the sensor for executing the sequence, when the enable signal at the input control port is a voltage which is above or below a predefined threshold, or when the enable signal at the input control port is above a first predefined voltage and below a second predefined voltage wherein the first predefined voltage is larger than the second predefined voltage, or when the enable signal at the input control port is a rising edge and/or a falling edge or when the enable signal is a pulse or a plurality of pulses of a voltage at the input control port.

4. The sensor according to claim 1, wherein the sensor is configured for repeating the sequence with a predefined period if the enable signal at the input control port lasts longer than the predefined period.

5. The sensor according to claim 4, wherein the sensor comprises a comparator, for comparing the measured physical property with a threshold value, and an output switch and wherein the output interface comprises a first and a second output node with the output switch connected between the first and the second output node, wherein the sensor is configured for switching the output switch when the threshold value is crossed.

6. The sensor according to claim 1, wherein the sensor is a magnetic field sensor, or a capacitive sensor, or an optical sensor, or an inductive sensor.

7. The sensor according to claim 1, the sensor comprising a comparator, for comparing the measured physical property with a threshold value, and an output switch, wherein the output interface comprises a first output node connected to the output switch, wherein the sensor is configured for switching the output switch when the threshold value is crossed.

8. A sensing system for measuring a physical property, the sensing system comprising a plurality of sensors according to claim 1,
wherein the output control port of an earlier sensor is connected with the input control port of a next sensor thus forming a chain of sensors, wherein a first sensor of the sensors in the chain is configured for repeating the sequence with a predefined period if the enable signal at the input control port lasts longer than the predefined period.

9. The sensing system according to claim 8, wherein each sensor comprises a comparator, for comparing the measured physical property with a threshold value, and an output switch and wherein the output interface of each sensor comprises a first and a second output node with the output switch connected between the first and the second output node, wherein each sensor is configured for switching the output switch when the threshold value is crossed,
the sensing system comprising a resistive divider comprising a plurality of resistors with connecting nodes between the resistors, wherein the first output nodes of the sensors are connected with the respective connecting nodes and wherein the second output nodes are connected together.

10. The sensing system according to claim 8, wherein all sensors are configured for repeating the sequence with a predefined period if the enable signal at the input control port lasts longer than the predefined period.

11. The sensing system according to claim 8, the sensing system comprising one or more AD converters connected with the output interface or a display device directly connected with the output interface and configured for displaying the measured physical property.

12. The sensing system according to claim 8, wherein the first sensor comprises a control circuit, which is connected with the input control port, configured for triggering the first sensor for executing the sequence, when the enable signal at the input control port is a voltage which is above or below a predefined threshold, or when the enable signal at the input control port is above a first predefined voltage and below a second predefined voltage wherein the first predefined voltage is larger than the second predefined voltage, or when the enable signal at the input control port is a rising edge and/or a falling edge or when the enable signal is a pulse or a plurality of pulses of a voltage at the input control port; and
wherein the input control port of the first sensor is connected to a fixed potential or wherein the first sensor comprises a control circuit, connected with the input control port, configured for triggering the first sensor for executing the sequence when the enable signal at the input control port is a fixed potential or a floating voltage and wherein the input control port of the first sensor is left floating.

13. The sensing system according to claim 8 wherein each output control port of one sensor, which is connected with an input control port of another sensor, is only connected with one input control port.

14. The sensing system according to claim 8, wherein at least one of the output control ports is connected with more than one input control port.

15. A position sensing device, the position sensing device comprising a sensing system according to claim 8, wherein the sensors are configured for measuring a magnetic field, the position sensing device, furthermore, comprising a magnet and a positioning system which is configured for guiding the magnet along the sensors.

* * * * *